(12) United States Patent
Lee et al.

(10) Patent No.: US 9,728,252 B2
(45) Date of Patent: Aug. 8, 2017

(54) RESISTIVE MEMORY DEVICE WITH TEMPERATURE COMPENSATION, RESISTIVE MEMORY SYSTEM, AND OPERATING METHOD THEREOF

(71) Applicant: SAMSUNG ELECTRONICS CO., LTD., Suwon-si, Gyeonggi-do (KR)

(72) Inventors: Yong-kyu Lee, Hwaseong-si (KR); Yeong-taek Lee, Seoul (KR); Dae-seok Byeon, Seongnam-si (KR); In-gyu Baek, Seoul (KR); Man Chang, Seoul (KR); Lijie Zhang, Suwon-si (KR); Hyun-kook Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/796,131

(22) Filed: Jul. 10, 2015

(65) Prior Publication Data
US 2016/0099049 A1    Apr. 7, 2016

(30) Foreign Application Priority Data
Oct. 2, 2014    (KR) ........................ 10-2014-0133554

(51) Int. Cl.
*G11C 7/04*      (2006.01)
*G11C 13/00*     (2006.01)
*G11C 11/56*     (2006.01)
*G11C 11/16*     (2006.01)

(52) U.S. Cl.
CPC ........ *G11C 13/004* (2013.01); *G11C 11/5607* (2013.01); *G11C 11/5678* (2013.01); *G11C 11/5685* (2013.01); *G11C 13/0064* (2013.01); *G11C 7/04* (2013.01); *G11C 11/1673* (2013.01);
(Continued)

(58) Field of Classification Search
CPC .... G11C 7/04; G11C 7/08; G11C 7/14; G11C 7/227; G11C 13/004; G11C 13/0064; G11C 13/0004; G11C 13/0007; G11C 13/0011; G11C 11/5614; G11C 11/5642; G11C 11/5678; G11C 11/5685; G11C 2013/0045; G11C 2013/0054
See application file for complete search history.

(56) References Cited

U.S. PATENT DOCUMENTS

| | | |
|---|---|---|
| 6,762,474 B1 | 7/2004 | Mills, Jr. |
| 6,967,884 B2 | 11/2005 | Hsu |
| 7,898,840 B2 | 3/2011 | Maejima |

(Continued)

FOREIGN PATENT DOCUMENTS

| | | |
|---|---|---|
| KR | 10-2010-0015195 A | 2/2010 |
| KR | 10-2012-0079738 A | 7/2012 |

*Primary Examiner* — Andrew Q Tran
(74) *Attorney, Agent, or Firm* — Lee & Morse, P.C.

(57) ABSTRACT

A method for operating a memory device includes sensing a change in temperature of the memory device, adjusting a level of a reference current for a read operation, and reading data from memory cells of the memory device based on the adjusted level of the reference current. The level of the reference current is adjusted from a reference value to a first value when the temperature of the memory device increases and is adjusted from the reference value to a second value when the temperature of the memory device decreases. A difference between the reference value and the first value is different from a difference the reference value and the second value.

8 Claims, 19 Drawing Sheets

(52) U.S. Cl.
CPC .. *G11C 13/0004* (2013.01); *G11C 2013/0054* (2013.01)

(56) References Cited

U.S. PATENT DOCUMENTS

| | | |
|---|---|---|
| 8,050,084 B2 | 11/2011 | Bae et al. |
| 8,149,611 B2 | 4/2012 | Maejima |
| 8,213,254 B2 | 7/2012 | Choi et al. |
| 8,228,709 B2 | 7/2012 | Choi |
| 8,351,252 B2 | 1/2013 | Chung |
| 8,432,722 B2 | 4/2013 | Maejima |
| 8,437,171 B1 | 5/2013 | Gilbert |
| 8,526,226 B2 | 9/2013 | Lym et al. |
| 8,559,218 B2 | 10/2013 | Porter et al. |
| 2007/0064489 A1* | 3/2007 | Bauser ................ G11C 11/4099 365/185.21 |
| 2011/0063903 A1 | 3/2011 | Kang et al. |
| 2014/0098600 A1 | 4/2014 | Kim et al. |

* cited by examiner

RESISTIVE MEMORY DEVICE WITH TEMPERATURE COMPENSATION, RESISTIVE MEMORY SYSTEM, AND OPERATING METHOD THEREOF

CROSS-REFERENCE TO RELATED APPLICATION

Korean Patent Application No. 10-2014-0133554, filed on Oct. 2, 2014, and entitled, "Resistive Memory Device, Resistive Memory System, and Operating Method Thereof," is incorporated by reference herein in its entirety.

BACKGROUND

1. Field

One or more embodiments described herein relate to a resistive memory device, a resistive memory system, and a method of operating a resistive memory device.

2. Description of the Related Art

Developing non-volatile memory devices with improved speed, capacity, stability, integration, and power consumption remains a focus of system designers. These types of memories do not have to be refreshed and therefore are the memories of choice in many applications. Examples of non-volatile memories include dynamic random access memory (DRAMs), flash memories, static RAMs (SRAMs), phase change RAMs (PRAMs), nano floating gate memory (NFGMs), polymer RAMs (PoRAMs), magnetic RAMs (MRAMs), ferroelectric RAMs (FeRAMs), resistive RAMs (RRAMs), to name a few.

SUMMARY

In accordance with one or more embodiments, a method for operating a resistive memory device includes sensing a change in temperature of the memory device; adjusting a level of a reference current from a reference value to a first value for a read operation when the temperature increases and from the reference value to a second value for the read operation when the temperature decreases; and reading data from memory cells of the memory device based on the adjusted level of the reference current, wherein a difference between the reference value and the first value is different from a difference the reference value and the second value. The first value may be greater than the reference value, and the second value may be less than the reference value.

Adjusting the level of the reference current may include adjusting the reference value to the first value or the second value based on a current control signal. Sensing the temperature change may include generating a first sensing signal indicating an increase in temperature compared to a normal state or a second sensing signal indicating a decrease in temperature compared to the normal state, and adjusting the level of the reference current may include adjusting the level of the reference current to the first value or the second value based on the first sensing signal or the second sensing signal.

Reading the data may include comparing a sensing node voltage with a reference voltage, wherein the sensing node voltage is applied to a sensing node based on the adjusted level of the reference current. The memory cells may include multilevel cells and the method may include changing first to n-th reference currents, where n≥2, and reading data from the multilevel cells based on the first to n-th reference currents, wherein levels of the first to n-th reference currents are changed by different amounts.

The sensing may include sensing that the change in temperature corresponds to one of m-number of states compared to a normal state, where m≥2, and adjusting the level of the reference current may include adjusting the level of the reference current to one of m-number of levels based on the sensed one of the m-number of states. A difference in the level between the reference value and the first value may be less than a difference in the level between the reference value and the second value.

In accordance with one or more other embodiments, a method for operating a resistive memory device includes sensing a change of temperature of the memory device; setting a read condition by changing a value of at least one read factor of a plurality of read factors based on the sensed temperature; and performing a read operation according to the set read condition, wherein setting the read condition includes setting a hot read condition or a cold read condition by changing a value of a first read factor based on the sensed temperature, the first read factor changed by different amounts in the hot read condition and the cold read condition.

Setting the read condition may include setting one read condition from a group consisting of m-number of hot read conditions and n-number of cold read conditions based on the sensed temperature, wherein m≥1 and n≥1 and wherein a value of the first read factor differs according to the set read condition. The first read factor may have a value corresponding to a level of a reference current, the method may include increasing the level of the reference current from a reference value to a first value in the hot read condition and decreasing the level of the reference current from the reference value to a second value in the cold read condition, the level of the reference current in the hot read condition to change by an amount less than the level the reference current changes in the cold read condition.

The first read factor may have a value which corresponds to an activation timing of a sensing enable signal for a sense amplifier that determines data, and the method may include changing the activation timing of the sensing enable signal to occur earlier than a reference timing in the hot read condition and changing the activation timing of the sensing enable signal to occur later than the reference timing in the cold read condition. The sense amplifier circuit may determine the data by comparing a voltage of a sensing node and a reference voltage.

The method may include activating the sensing enable signal when a voltage level of the sensing node connected to a memory cell corresponding to a first resistance is less than a level of the reference voltage and when the voltage level of the sensing node connected to the memory cell corresponding to a second resistance is greater than the level of the reference voltage, the second resistance greater than the first resistance. The first read factor may have a value which corresponds to a level of a reference voltage provided to a sense amplifier circuit that determines data, the method may include decreasing a level of the reference voltage from a reference value to a first value in the hot read condition and increasing the level of the reference voltage from the reference value to a second value in the cold read condition, and the level of the reference voltage in the hot read condition changes by an amount less than an amount by which the level of the reference voltage changes in the cold read condition.

The read operation may correspond to a verification read operation for a memory cell to which data is written, the first read factor may have a value based on a level of verification current, and the method may include increasing a level of the verification current from a reference value to a first value in the hot read condition and decreasing the level of the verification current from the reference value to a second value in the cold read condition, the level of the verification current in the hot read condition to change by an amount less than an amount the level of the verification current is to change in the cold read condition.

In accordance with one or more other embodiments, a method for operating a memory includes adjusting at least one read factor to a first value based on a first temperature change of the memory and to a second value based on a second temperature change of the memory; and reading data from memory cells of the memory based on the at least one adjusted read factor, wherein the first value is different from the second value. Adjusting the at least one read factor may include adjusting a timing or level of the at least one read factor. The first temperature change may be a temperature increase, and the second temperature change may be a temperature decrease.

The at least one read factor may include a reference current for a read operation, and adjusting the at least one read factor may include adjusting the reference current to the first value based on the first temperature change and to the second value based on a second temperature change of the memory. The first value may be offset from a reference value of the reference current by a first difference, the second value may be offset from the reference value of the reference current by a second difference, and the first difference may be less than the second difference.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
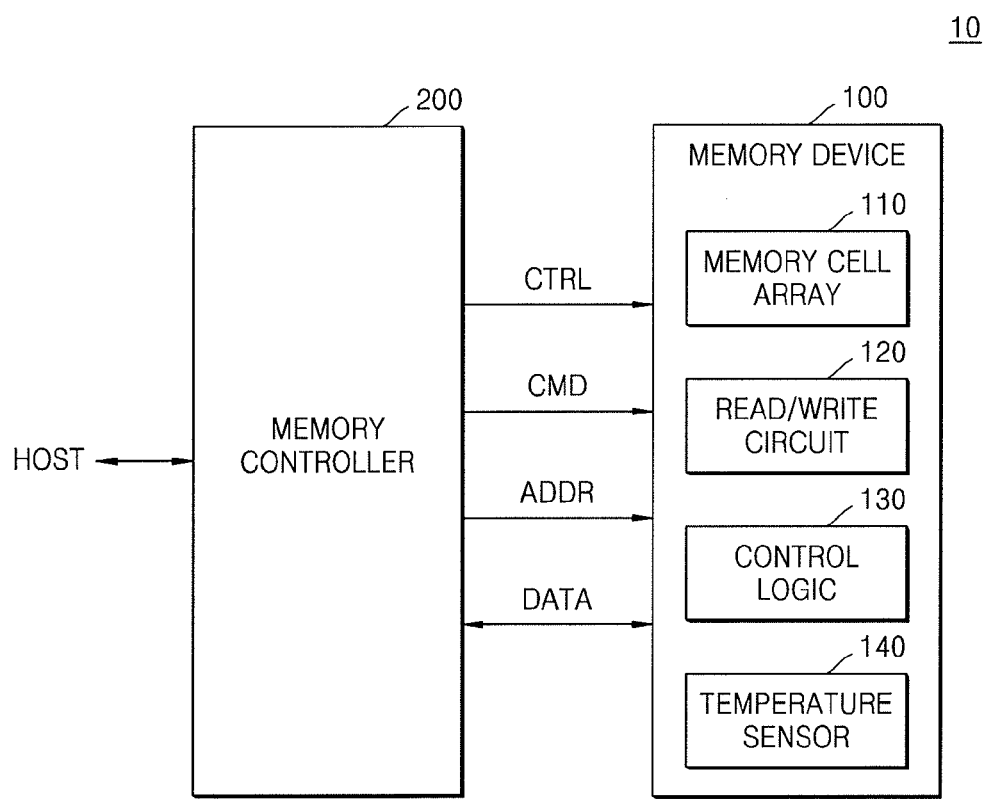
FIG. 1 illustrates an embodiment of a memory system.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

Terms used in the present specification are used for explaining a specific exemplary embodiment, not for limiting the present inventive concept. Thus, an expression used in a singular form in the present specification also includes the expression in its plural form unless clearly specified otherwise in context. Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Terms such as "first" and "second" are used herein merely to describe a variety of constituent elements, but the constituent elements are not limited by the terms. Such terms are used only for the purpose of distinguishing one constituent element from another constituent element. For example, without departing from the right scope of the present inventive concept, a first constituent element may be referred to as a second constituent element, and vice versa.

Unless defined otherwise, all terms used herein including technical or scientific terms have the same meanings as those generally understood by those of ordinary skill in the art to which the present inventive concept may pertain. The terms as those defined in generally used dictionaries are construed to have meanings matching that in the context of related technology and, unless clearly defined otherwise, are not construed to be ideally or excessively formal.

FIG. 1 illustrates an embodiment of a memory system 10 including a memory device 100. In the present exemplary embodiment, the memory device may include resistive memory cells and therefore may be referred to as a resistive memory device. In another embodiment, the memory device may include another type of memory cell. For example, the memory cells may be arranged at regions where a plurality of first signal lines and a plurality of second signal lines intersect. Such a memory device therefore may be referred to as a cross-point memory device. In the following description, the memory device is discussed as a resistive memory device for illustrative purposes only.

Referring to FIG. 1, the memory system 10 includes the memory device 100 and a memory controller 200. The memory device 100 includes a memory cell array 110, a read/write circuit 120, control logic 130, and a temperature sensor 140. When the memory cell array 110 includes resistive memory cells, the memory system 10 may be referred to be a resistive memory system 10.

Based on a write/read request from a host, the memory controller 200 may control the memory device 100 to read data stored in the memory device 100 or write data to the memory device 100. For example, the memory controller 200 may control programming (or writing), reading, and erasing operations with respect to the memory device 100 by providing the memory device 100 with address (ADDR), command (CMD), and control signal (CTRL). Also, data to be written (DATA) and read data (DATA) may be transceived between memory controller 200 and memory device 100.

The memory controller 200 may include, for example, RAM, a processing unit, a host interface, and a memory interface. The RAM may be used as an operation memory of the processing unit. The processing unit may control the operation of the memory controller 200. The host interface may operate based on one or more predetermined protocols to exchange data between the host and the memory controller 200. For example, the memory controller 200 may be configured to communicate with an external device HOST via at least one of a universal serial bus (USB), multi-media card (MMC), peripheral component interconnect express (PCI-E), advanced technology attachment (ATA), Serial-ATA, Parallel-ATA, small computer system interface (SCSI), enhanced small disk interface (ESDI), or integrated drive electronics (IDE).

The memory cell array 110 may include a plurality of memory cells arranged at the regions where the first signal lines and the second signal lines intersect. In one exemplary embodiment, the first signal lines may be bit lines and the second signal lines may be words lines. In another exemplary embodiment, the first signal lines may be word lines and the second signal lines may be bit lines.

Each of the memory cells may be a single-level cell (SLC) where one bit of data is stored or a multi-level cell (MLC) where at least two bits of data are stored. In another embodiment, the memory cell array 110 may include a combination of SLCs and MLCs. When one bit of data is written to one memory cell, the memory cells may have two resistance level distributions according to the written data. When two bits of data are written to one memory cell, the memory cells may have four resistance level distributions according to the written data. When three bits of data are written to one memory cell (e.g., a triple level cell (TLC)), the memory cells may have eight resistance level distributions according to the written data. In another embodiment, the memory cells each may store four or more bits of data.

Also, in one exemplary embodiment, the memory cell array 110 may include memory cells in a two-dimensional horizontal structure. In another exemplary embodiment, the memory cell array 110 may include memory cells in a three-dimensional vertical structure.

In another embodiment, the memory cell array 110 may include resistive memory cells having variable resistance devices. For example, when the variable resistance device includes a phase change material such as germanium-antimony-tellurium (GST or Ge—Sb—Te) and thus resistance changes according to temperature, the resistive memory device may be PRAM. In another example, when the variable resistance device is formed of an upper electrode, a lower electrode, and a complex metal oxide interposed therebetween, the resistive memory device may be RRAM. In another example, when the variable resistance device is formed of a magnetic upper electrode, a magnetic lower electrode, and a dielectric material interposed therebetween, the resistive memory device may be MRAM.

The read/write circuit 120 performs read and write operations for the memory cells. The read/write circuit 120 may be connected to the memory cells via a plurality of bit lines, and may include a write driver to write data to the memory cells and a sense amplifier for sensing resistance components of the memory cells.

The control logic 130 may control overall operation of the memory device 100, and also may control the read/write circuit 120 to perform memory operations such as writing and reading. In an example, the memory device 100 may include a power generator for generating various write voltages and read voltages used for the read and write operations. Levels of the write voltage and the read voltage may be adjusted under the control of the control logic 130. Also, in an example, the memory device 100 may include a reference signal generator for generating various reference signals used for a read operation. For example, the reference signal generator may generate a reference current and/or a reference voltage. Levels of the reference current and/or the reference voltage may be adjusted under control of the control logic 130.

In the write operation of the memory device 100, a resistance value of a variable resistor of a memory cell of the memory cell array 110 may increase or decrease according to write data. For example, each of the memory cells of the memory cell array 110 may have a resistance value according to currently stored data and the resistance value may increase or decrease according to data to be written to each memory cell. The above write operation may be classified into a reset write operation and a set write operation. In the resistive memory cell, a set state may have a relatively low resistance value, whereas a reset state may have a relatively high resistance value. The reset write operation may perform a write operation in a direction in which the resistance value of the variable resistor increases. The set write operation may perform a write operation in a direction in which the resistance value of the variable resistor decreases.

The read operation for the memory device 100 may be performed by various methods. For at least some read methods, the read operation may be performed by one or more read factors. If the read methods are different from each other, one or more read factors may be different from each other. For example, a current sensing method may include a reference current and a reference voltage as read factors. In the current sensing method, the reference current is applied to a selected memory cell and data may be determined by comparing a voltage of a sensing node caused by the reference current with the reference voltage.

A voltage sensing method may include a precharge voltage and a reference voltage as read factors. In the voltage sensing method, the sensing node is precharged to a predetermined level and then the level is decreased by current flowing in the memory cell. Data may be determined by comparing the voltage of the sensing node with the reference voltage.

According to the present exemplary embodiment, the temperature sensor 140 senses the temperature of the memory device 100 and generates a sense signal. The temperature may be, for example, a temperature inside, near, or adjacent the memory device 100. A read condition for the memory cell array 110 may be differently set according to the temperature. For example, the level or timing of at least one read factor may be adjusted corresponding to a change in temperature. A variety of read methods may be employed in the read operation and different read factors may be adjusted according to each read method.

According to the above operation, data may be stably read as compensation is performed corresponding to the change of temperature, and this is so even when the characteristics of a memory cell are changed according to temperature. Also, optimal read conditions may be set for each of the various read methods. Also, the read conditions may be set by changing a value and/or timing of one of the read factors. These factors may be easily adjusted and therefore temperature compensation may be easily performed.

In one example embodiment, the memory controller 200 and the memory device 100 may be integrated as one semiconductor device. For example, the memory controller 200 and the memory device 100 may be integrated as one semiconductor device forming a memory card, e.g., a PC card (PCMCIA), a compact flash card (CF), a smart media card (SM/SMC), a memory stick, a multimedia card (MMC, RS-MMC, or MMCmicro), an SD card (SD, miniSD, or microSD), a universal flash memory (UFS), etc. In another example, the memory controller 200 and the memory device 100 may be integrated as one semiconductor device forming a solid state disk/drive (SSD).

Figure 2:
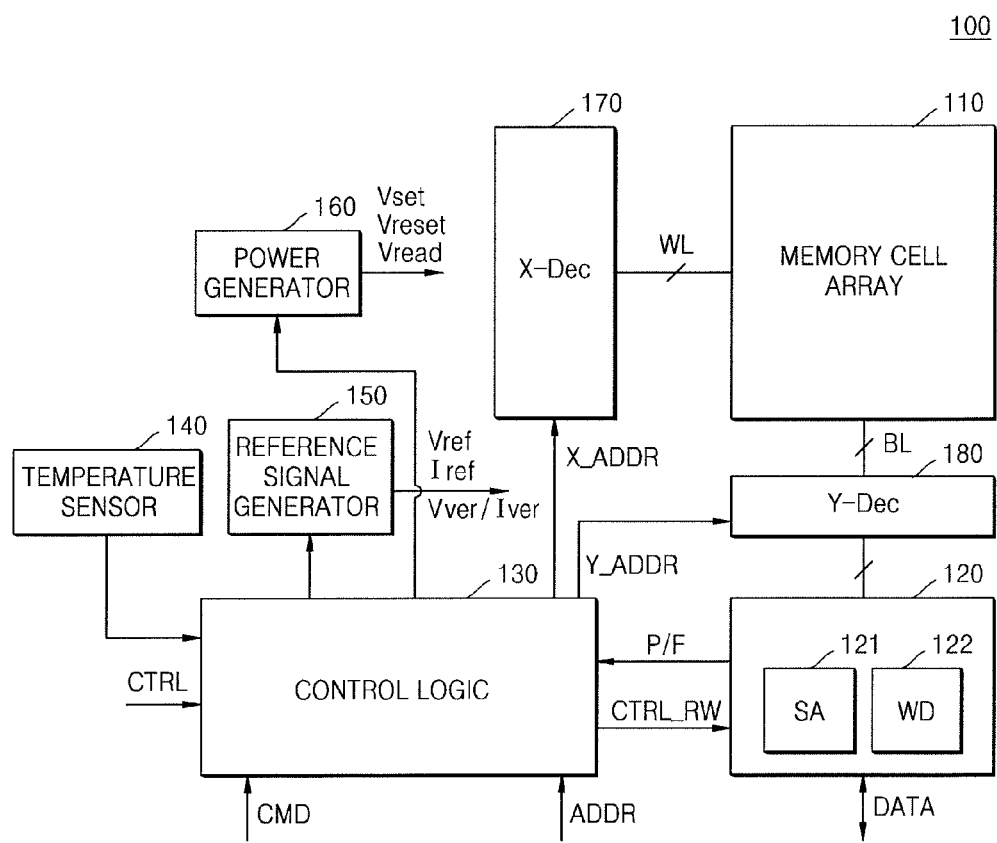
FIG. 2 illustrates an embodiment of a memory device.

FIG. 2 illustrates an embodiment of the memory device 100 in FIG. 1. Referring to FIG. 2, the memory device 100 includes the memory cell array 110, the read/write circuit 120, control logic 130, and the temperature sensor 140. Also, the memory device 100 may include a reference signal generator 150, a power generator 160, a row decoder 170, and a column decoder 180. Also, the read/write circuit 120 may include a sense amplifier 121 and a write driver 122.

In memory device 100, memory cells in the memory cell array 110 may be connected to a plurality of first signal lines and a plurality of second signal lines. For example, the first signal lines may be bit lines BL and the second signal lines may be word lines WL. As various voltage signals or current signals are provided through the bit lines BL and the word lines WL, data may be read from or written to selected memory cells and data reading or writing on the other non-selected memory cells may be prevented.

In one example embodiment, an address ADDR to indicate a memory cell to access may be received with a command CMD. The address ADDR may include a row address X_ADDR to select the word line WL of the memory cell array 110 and a column address Y_ADDR to select the bit line BL of the memory cell array 110. The row decoder 170 performs a word line selection operation based on the row address X_ADDR. The column decoder 180 performs a bit line selection operation based on the column address Y_ADDR.

The read/write circuit 120 is connected to the bit lines BL and may write data to the memory cell or may read data from the memory cell. For example, at least part of a voltage signal or a current signal may be provided to the memory cell array 110 through the read/write circuit 120. In an exemplary embodiment, when the memory operation is performed in a uni-polar method, a set voltage Vset and a reset voltage Vreset may be provided to the memory cell through the read/write circuit 120. In another exemplary embodiment, when the memory operation is performed in a bi-polar method, the reset voltage Vreset may be provided to the memory cell through the row decoder 170. Also, a read voltage Vread may be provided to the read/write circuit 120 and used for the read operation.

In one example embodiment, the reference signal generator 150 may generate a reference voltage Vref and a reference current Iref as various reference signals related to a data read operation. For example, during the data read operation, the sense amplifier 121 may be connected to one node (e.g., a sensing node) of the bit line BL to determine data. A data value may be determined by a comparison operation between a sensing voltage of the sensing node and the reference voltage Vref. When the current sensing method is employed, the reference signal generator 150 may generate the reference current Iref and provide the reference current Iref to the memory cell array 110. A data value may be determined by comparing a voltage of the sensing node caused by the reference current Iref with the reference voltage Vref.

After data is written, a verification operation may be performed, for example, by applying a verification voltage Vver and/or verification current Iver to the memory cell array 110.

According to the present exemplary embodiment, the read condition may be differently set according to the temperature sensed by the temperature sensor 140. In an example, a sensing signal from the temperature sensor 140 may be provided to the control logic 130, and the control logic 130 may generate various control signals to change the read condition according to the sensing signal. In an example, levels of various signals output from the power generator 160 may vary under the control of the control logic 130. Also, levels of various reference signals output from the reference signal generator 150 may be changed. Also, at least one of the control signals generated by the control logic 130 may be provided to the read/write circuit 120. The read condition may be changed by controlling various parts in the read/write circuit 120.

In another exemplary embodiment, the sensing signal from the temperature sensor 140 may be provided directly to function blocks, to which the read factors changed according to the change of temperature are applied. For example, the sensing signal from the temperature sensor 140 may be provided to each of the reference signal generator 150, the power generator 160, and the read/write circuit 120. Also, at least one of various power signals or reference signals serving as the read factors may be changed based on the sensing signal.

According to the present exemplary embodiment, values and/or timing of the various read factors may be changed based on the sensed temperature. For example, when data is read by the current sensing method, the reference current Iref is applied to the memory cell and the level of the reference current Iref may vary according to a change in temperature. In an example, when temperature increases, the level of the reference current Iref may be adjusted to increase. When temperature decreases, the level of the reference current Iref may be adjusted to decrease.

Also, in the determining whether the temperature increases or decreases, a temperature range corresponding to a normal state may be defined. When the temperature of (e.g., inside) the memory device 100 is greater than the temperature of the normal state, the memory device 100 may be in a hot state. When the temperature of the memory device 100 is lower than the temperature of the normal state, the memory device 100 may be in a cold state. When in a hot state, a hot read condition may be set as at least one of the read factors is changed. When in a cold state, a cold read condition may be set as at least one of the read factors is changed.

When data is read by the voltage sensing method, one node of the memory cell is precharged to a predetermined level. As temperature varies, the value of at least one of the read factors used in the voltage sensing method may be changed as temperature varies. In an example, data may be determined by timing, for example, timing to activate the sense amplifier 121, for comparing the voltage of a sensing node with the reference voltage Vref. The read condition may be adjusted by adjusting the activation timing corresponding to the change in temperature. In one embodiment, the reference voltage Vref, the precharge signal, and a clamping signal may be included as factors of the read condition. In this case, the read condition may be adjusted by changing the value of at least one of the reference voltage Vref, the precharge signal, or the clamping signal.

An amount of change of the resistance value of the variable resistor of the resistive memory cell may vary according to temperature. For example, the resistance value of the variable resistor may vary non-linearly according to temperature. The amount of change may be adjusted, for example, non-linearly according to a sensed temperature value as the level and timing of the read factors are adjusted.

The memory cell array 110 may include a multilevel cell that stores two or more bits of data per memory cell. A plurality of read conditions may be defined to read multi-bit data from the multilevel cell. According to the present exemplary embodiment, the read condition may be adjusted by changing at least one of the read factors with respect to each of the read conditions corresponding to the change in temperature. Also, the read conditions may be set to have different amounts of change with respect to the read factors.

Figure 3:
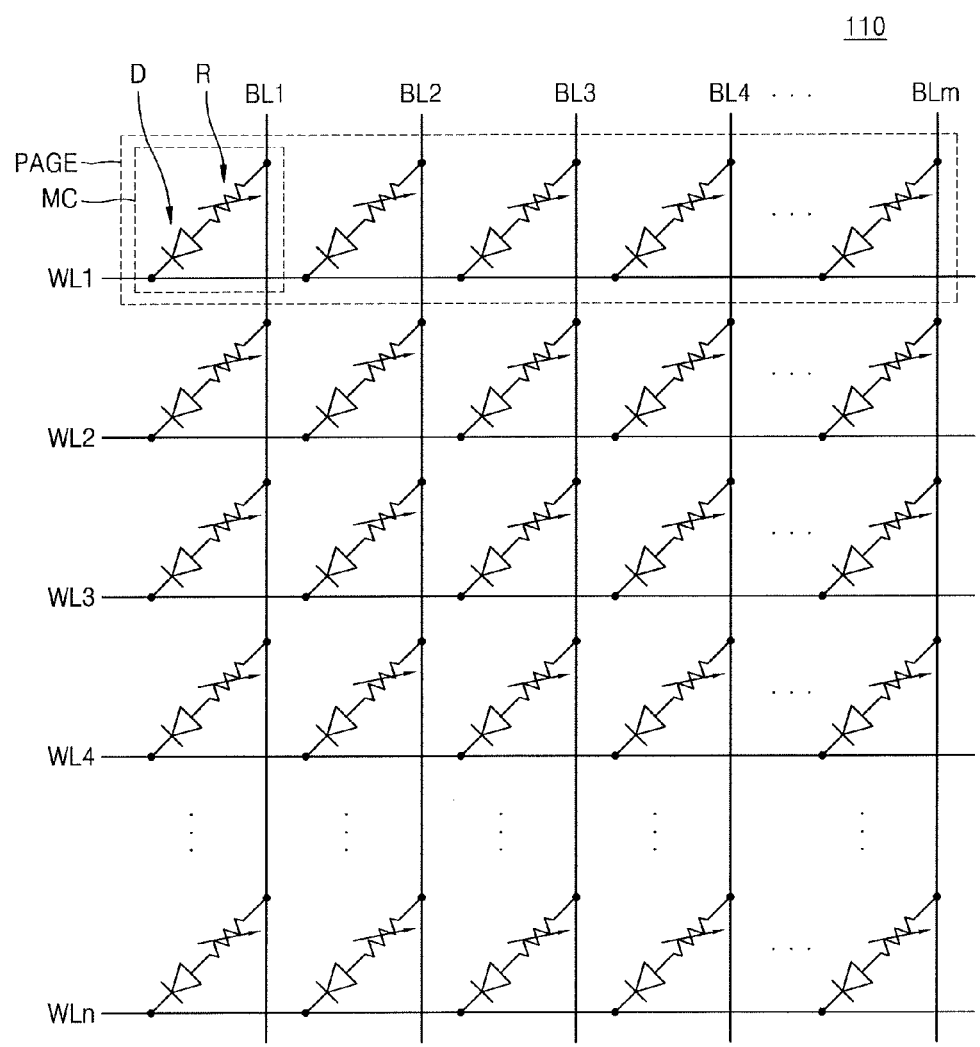
FIG. 3 illustrates an embodiment of a memory cell array.

FIG. 3 illustrates an embodiment of the memory cell array 110 having a plurality of cell blocks. Referring to FIG. 3, the memory cell array 110 includes a plurality of word lines WL1-WLn, a plurality of bit lines BL1-BLm, and a plurality of memory cells MC. The numbers of the word lines WL, bit lines BL, and memory cells MC may be different for different embodiments. Also, the memory cells MC connected to the same word line WL may be defined for each page.

Each memory cell MC includes a variable resistor R and a selective device D. The variable resistor R may be referred to as a variable resistance device or a variable resistor material. The selective device D may be referred to as a switching device.

In one exemplary embodiment, the variable resistor R may be connected between one of the bit lines BL1-BLm and the selective device D. The selective device D may be connected between the variable resistor R and one of the word lines WL1-WLn. In another embodiment, the selective device D may be connected between one of the bit lines BL1-BLm and the variable resistor R, and the variable resistor R may be connected between the selective device D and one of the word lines WL1-WLn.

The variable resistor R may have one of a plurality of resistance states based on an applied electrical pulse. In one exemplary embodiment, the variable resistor R may include a phase-change material having a crystal state that changes according to an amount of current. Examples of phase-change materials include two-element compounds such as GaSb, InSb, InSe, $Sb_2Te_3$, and GeTe, three-element compounds such as GeSbTe, GaSeTe, InSbTe, $SnSb_2Te_4$, and InSbGe, and four-element compounds such as AgInSbTe, (GeSn)SbTe, GeSb(SeTe), and $Te_{81}Ge_{15}Sb_2S_2$.

The phase-change material may have an amorphous state for a relatively high resistance and a crystal state for a relatively low resistance. The phase-change material may have a phase that changes according to Joule heating generated based on the amount of current. Accordingly, data may be written based on the phase change.

In another exemplary embodiment, instead of the phase-change material, the variable resistor R may include perovskite compounds, transition metal oxides, magnetic materials, ferromagnetic materials, or antiferromagnetic materials.

The selective device D may be connected between one of the word lines WL1~WLn and the variable resistor R and may control supply of current to the variable resistor R based on the voltage applied to the connected word line and bit line. In one exemplary embodiment, the selective device D may be a PN junction diode or a PIN junction diode. The anode of the diode may be connected to the variable resistor R and the cathode of the diode may be connected to one of the word lines WL1~WLn. When the voltage difference between the anode and cathode of the diode is greater than a critical voltage of the diode, the diode may be turned on to supply current to the variable resistor R.

Figure 4A:
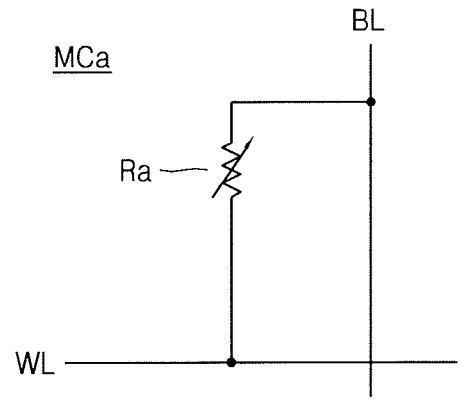
FIGS. 4A to 4C illustrate modified examples of a memory cell.
Figure 4B:
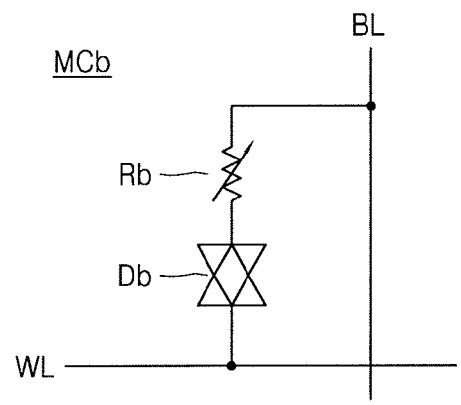
Figure 4C:
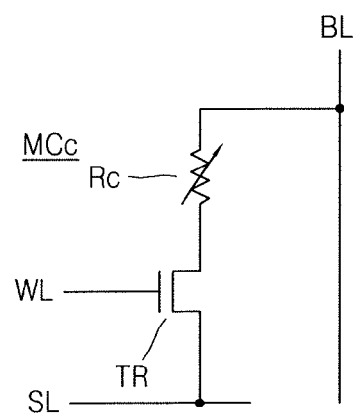

FIGS. 4A to 4C illustrate modified examples of the memory cell MC of FIG. 3.

Referring to FIG. 4A, a memory cell MCa may include a variable resistor Ra connected between a bit line BL and a word line WL. The memory cell MCa stores data based on voltages applied to the bit line BL and the word line WL.

Referring to FIG. 4B, a memory cell MCb includes a variable resistor Rb and a bidirectional diode Db. The variable resistor Rb may include a resistive material for storing data. The bidirectional diode Db may be connected between the variable resistor Rb and the word line WL. The variable resistor Rb may be connected between the bit line BL and the bidirectional diode Db. The positions of the bidirectional diode Db and the variable resistor Rb may be switched with each other. The bidirectional diode Db may block leakage current flowing through a non-selective resistance cell.

Referring to FIG. 4C, a memory cell MCc includes a variable resistor Rc and a transistor TR. The transistor TR may be a selective device (e.g., a switching device) that permits or blocks supply of current to the variable resistor Rc according to the voltage of the word line WL. In the exemplary embodiment of FIG. 4C, in addition to the word line WL, a source line SL may be included to adjust voltage levels at the opposite ends of the variable resistor Re. The transistor TR may be connected between the variable resistor Rc and the source line SL. The variable resistor R may be connected between the bit line BL and the transistor TR. The positions of the transistor TR and the variable resistor Rc may be switched with each other. The memory cell MCc may or may not be selected based on whether the transistor TR is turned on or off when driven by the word line WL.

Figure 5A:
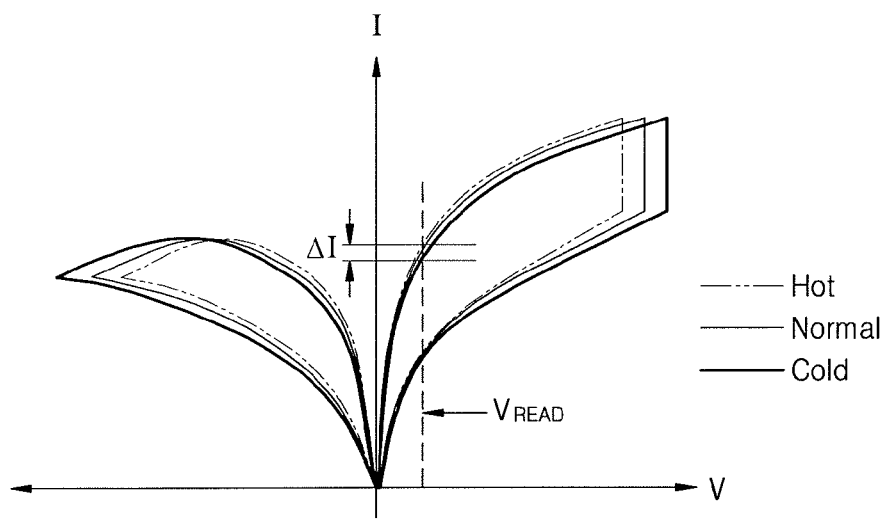
FIG. 5A illustrates an example of a voltage-current characteristic curve of a memory cell based on temperature.
Figure 5B:
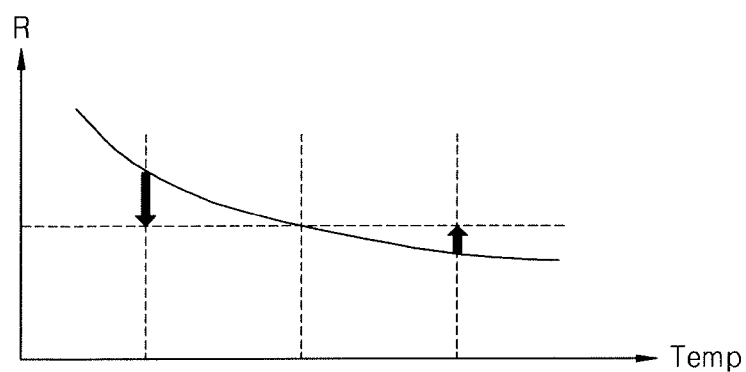
FIG. 5B illustrates an example of a change in resistance value based on temperature.

FIG. 5A illustrates an example of a voltage-current characteristic curve of the memory cell MC based on changes in temperature, and FIG. 5B illustrates an example of changes in a resistance value based on temperature change. The temperature change may be indicated by a normal state, a hot state, and a cold state. Also, for convenience of explanation, the memory cell MC is considered to be a single level cell.

Referring to FIG. 5A, the horizontal axis denotes voltage V and the vertical axis denotes current I. The characteristics of the memory cell MC change as temperature changes. In the hot state, current (e.g., cell current) flowing in the memory cell MC increases (compared to the normal state) when the resistance value of the memory cell MC decreases for the same voltage applied to the memory cell MC. In the cold state, current (e.g., cell current) flowing in the memory cell MC decreases (compared to the normal state) when the resistance value of the memory cell MC increases for the same voltage is applied to the memory cell MC. For example, when the read voltage Vread is applied to the memory cell MC in the read operation, the level of cell current flowing in the memory cell MC in the hot state is greater than the level of the cell current flowing in the memory cell MC, for a same level of read voltage Vread applied to the memory cell MC. In FIG. 5A, this is illustrated as a level difference corresponding to ΔI.

As illustrated in FIG. 5B, the resistance value of the variable resistor of the memory cell changes with changes in temperature. For example, the resistance value decreases as temperature increases. Conversely, the resistance value increases as temperature decreases. The change in the resistance value based on temperature may therefore be non-linear. In adjusting the read condition, compensation may therefore be performed to correspond to the non-linear change in the resistance value.

Figure 6:
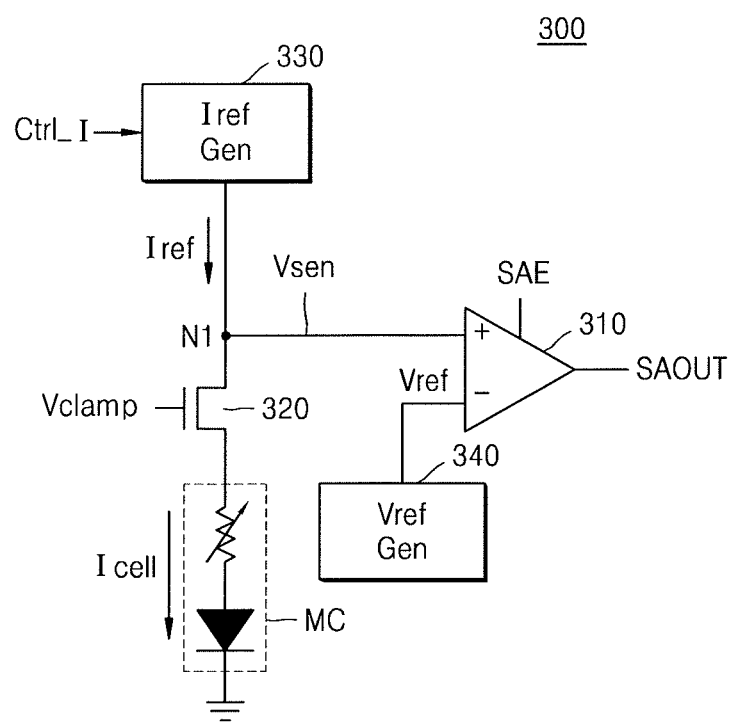
FIG. 6 illustrates an embodiment of a data read circuit.

FIG. 6 illustrates an embodiment of a data read circuit 300 which, for example, may be defined as including various peripheral circuits for performing a read operation on the memory cell. For example, the data read circuit 300 may be a circuit that determines data based on the current sensing method.

Referring to FIG. 6 the data read circuit 300 includes a sense amplifier circuit 310 connected to a sensing node N1 which corresponds to one node of the memory cell MC, a clamping transistor 320 for adjusting the level of a voltage of the sensing node N1, a reference current generator 330 for generating the reference current Iref, and a reference voltage generator 340 for generating the reference voltage Vref. In another embodiment, the data read circuit 300 may have a different configuration, e.g., may exclude one or more of the function blocks in FIG. 6 and/or may include one or more additional function blocks.

The sense amplifier circuit 310 receives a sensing voltage Vsen of the sensing node N1 and the reference voltage Vref and generates an output signal SAOUT based on a comparison of these voltages. The clamping transistor 320 may adjust (at least a certain amount of) the level of the voltage of the sensing node N1 and may be controlled based on a clamping signal Vclamp. In one example, the level of the sensing voltage Vsen of the sensing node N1 may be changed, based on a clamping operation performed by the clamping transistor, to a level suitable to be sensed by the sense amplifier circuit 310.

The reference current Iref may be provided to the memory cell MC through the clamping transistor 320. The reference current generator 330 generates the reference current Iref and may be embodied to include, for example, a current mirror.

A cell current Icell flowing in the memory cell MC may vary according to the resistance value of the variable resistor. For example, when the resistance value of the variable resistor is high, the cell current Icell having a relatively low level may flow. In contrast, when the resistance value of the variable resistor is low, the cell current Icell having a relatively high level may flow. In an example, when the resistance value of the variable resistor is high, the level of the reference current Iref may be greater than that of the cell current Icell. In contrast, when the resistance value of the variable resistor is low, the level of the reference current Iref may be smaller than that of the cell current Icell.

When the level of the reference current Iref is greater than that of the cell current Icell, the level of the voltage of the sensing node N1 may increase. In contrast, when the level of the reference current Iref is smaller than that of the cell current Icell, the level of the voltage of the sensing node N1 may decrease. Based on a sensing enable signal SAE, the sense amplifier circuit 310 may generate the output signal SAOUT having different values according to a result of the comparison of the levels of the sensing voltage Vsen and the reference voltage Vref.

To perform compensation based on temperature change, a current control signal Ctrl_I may be provided to the reference current generator 330 based on the sensed temperature. The reference current generator 330 may generate the reference current Iref to have that is a level adjusted according to the current control signal Ctrl_I. As in the above-described exemplary embodiment, when the temperature of (e.g., inside) the memory device 100 increases, the level of the reference current Iref may increase according to the current control signal Ctrl_I. When the temperature of (e.g., inside) the memory device 100 decreases, the level of the reference current Iref may decrease according to the current control signal Ctrl_I.

Figure 7A:
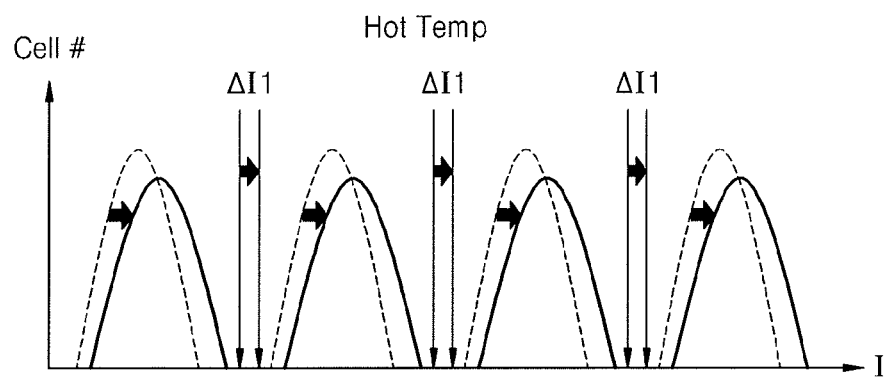
FIGS. 7A and 7B illustrate examples of memory cell distributions.
Figure 7B:
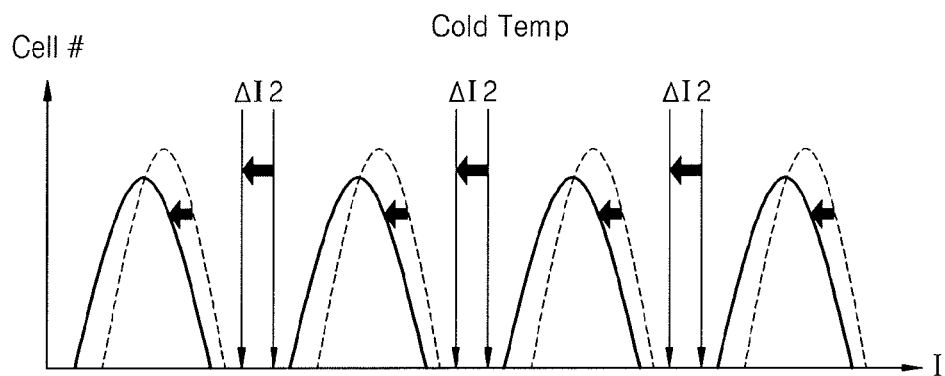
Figure 8:
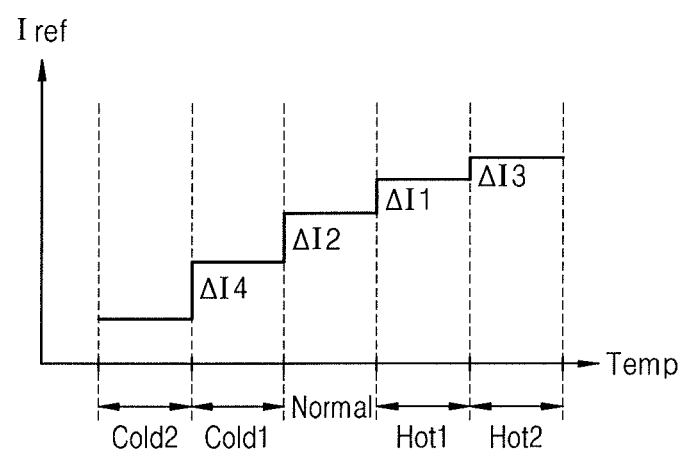
FIG. 8 illustrates an example of adjusting reference current.

FIGS. 7A, 7B, and 8 illustrate examples of temperature compensation performed based on the exemplary embodiment of FIG. 6. FIGS. 7A and 7B illustrate examples of a change in distribution of memory cells according to temperature change. FIG. 8 illustrates an example for adjusting reference current according to the temperature change. Also, FIGS. 7A and 7B illustrate a case in which each memory cell is a multilevel cell that stores two bits of data. Also, in FIGS. 7A and 7B, the horizontal axis indicates current level and the vertical axis indicates the number of memory cells.

Referring to FIG. 7A, the resistance value of the memory cell decreases in the hot state, e.g., where temperature is greater than in the normal state. When the resistance value decreases, the value of the cell current flowing in the memory cell increases. In this case, cell distributions in FIG. 7A are moved in a direction in which the current increases, e.g., to the right side. Accordingly, the reference current Iref has a level corresponding to the position between the cell distributions and may be compensated in a direction in which the level of current increases. Thus, a sensing margin between the cell distributions and the reference current Iref may be secured.

Referring to FIG. 7B, the resistance value of the memory cell increases in the cold state, e.g., where temperature is lower than that of the normal state. When the resistance value increases, the value of the cell current flowing in the memory cell decreases. In this case, cell distributions in FIG. 7B are moved in a direction in which the current decreases, e.g., to the left side. Accordingly, the reference current Iref has a level corresponding to the position between the cell distributions and may be compensated in a direction in which the level of current decreases. Thus, a sensing margin between the cell distributions and the reference current Iref may be secured.

When the temperature of the memory device 100 increases, the amount of movement of the cell distributions may be less than when the temperature of the memory device 100 decreases. For example, as illustrated in FIGS. 7A and 7B, when the temperature inside the memory device 100 changes from the normal state to the hot state, the reference current Iref increases by ΔI1. In contrast, when the temperature inside the memory device 100 is changes from the normal state to the cold state, the reference current Iref decreases by ΔI2. Since the amount of change of the resistance value increases when the temperature inside the memory device 100 is low, the value of ΔI2 may be set to be greater than the value of ΔI1. Accordingly, compensation reflecting the non-linearity feature of the change of the resistance value may be performed.

FIG. 8 illustrates an example in which the level of the reference current Iref is changed, step by step, based on temperature change. In this example, the hot state has at least two steps and the cold state has at least two steps.

Referring to FIG. 8, the level of the reference current Iref is adjusted according to the result of the sensed temperature. The level of the reference current Iref in the normal state may be assumed to have a normal value. The level of the reference current Iref may be increased or decreased relative to the normal value to correspond to the temperature change. Based on the sensed temperature, when the temperature inside the memory device 100 is in a first hot state HOT 1, the level of the reference current Iref may be increased by $\Delta I1$ from the normal value. When the temperature inside the memory device 100 is in a second hot state HOT 2 that is greater than the first hot state HOT 1, the level of the reference current Iref may be increased by $\Delta I3$ from the first hot state HOT 1.

When the temperature inside the memory device 100 is in a first cold state COLD 1, the level of the reference current Iref may be increased by $\Delta I2$ from the normal value. When the temperature inside the memory device 100 is in a second cold state COLD 2 that is less than the first cold state COLD 1, the level of the reference current Iref may be decreased by $\Delta I4$ from the first cold state COLD 1.

As the temperature increases, the amount of compensation may decrease. Thus, the value of $\Delta I3$ may be set to be less than the value of $\Delta I1$. As the temperature decreases, the amount of compensation may increase. Thus, the value of $\Delta I4$ may be set to be greater than the value of $\Delta I2$.

Figure 9A:
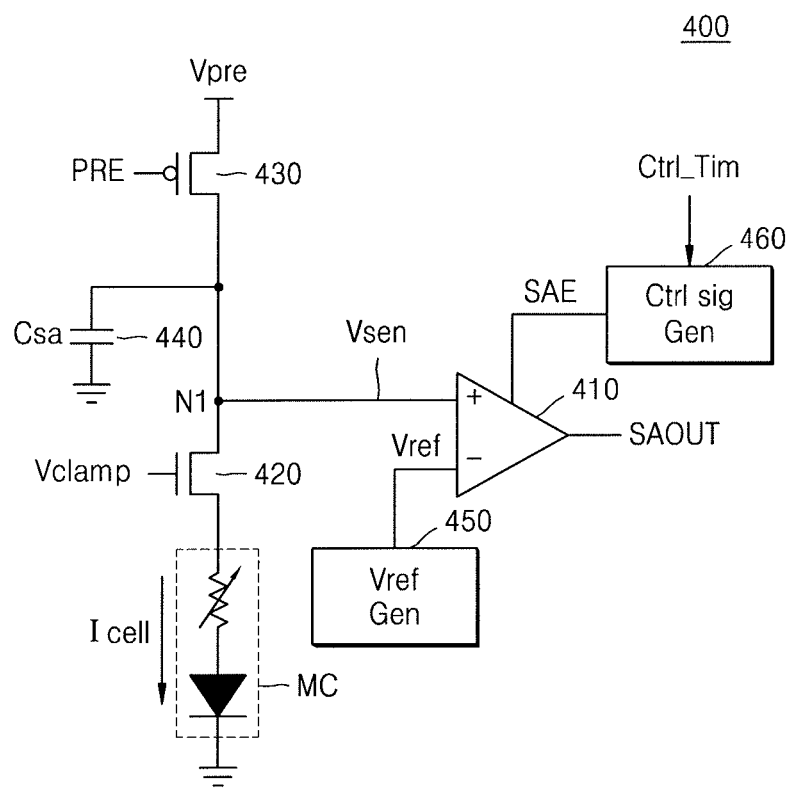
FIG. 9A illustrates an embodiment of a data read circuit and FIG. 9B illustrates an example of sensing enable timing.
Figure 9B:
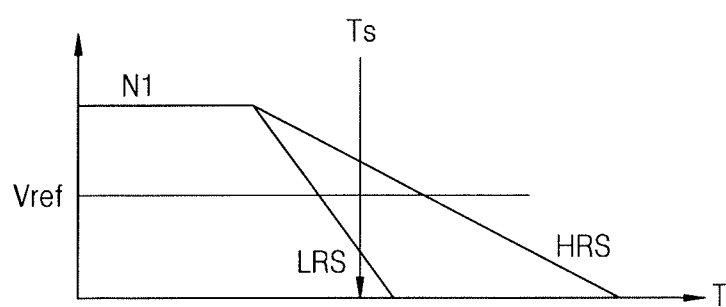

FIG. 9A illustrates an embodiment of a data read circuit 400 and FIG. 9B illustrates an example of a sensing enable timing. The data read circuit 400 indicates a circuit for determining data based on the voltage sensing method. As illustrated in FIG. 9A, the data read circuit 400 includes a sense amplifier circuit 410 connected to the sensing node N1 corresponding to one node of the memory cell MC, a clamping transistor 420 for adjusting the voltage of the sensing node N1, a precharge circuit 430 for precharging the sensing node N1 to a predetermined level, a capacitor Csa 440 connected to the sensing node N1, and a reference voltage generator 450 for generating the reference voltage Vref.

The sense amplifier circuit 410 may receive the sensing voltage Vsen of the sensing node N1 and the reference voltage Vref and may generate an output signal SAOUT through a comparison operation thereon. The sense amplifier circuit 410 may operate based on the sensing enable signal SAE, and the sensing enable signal SAE may be generated based on the control signal generator 460. The control signal generator 460 may control an activation time of the sensing enable signal SAE based on a timing control signal Ctrl_Tim which corresponds to the sensed temperature. The control signal generator 460 may be separately embodied in the memory device 100 or in the control logic 130 of FIG. 1.

The clamping transistor 420 may be arranged to adjust a certain amount of the level of the voltage of the sensing node N1, and may be controlled by the clamping signal Vclamp. As the precharge circuit 430 is switched by a precharge control signal PRE in a bit-line setup section, the sensing node N1 may be precharged to a level of a precharge voltage Vpre. The voltage charged at the sensing node N1 may be stored in the capacitor 440.

As the read operation starts, the clamping transistor 420 may be turned on. Electrical charges stored in the capacitor 440 may be transferred to a ground terminal through the memory cell MC. Accordingly, the cell current Icell flows in the memory cell MC. The level of the cell current Icell may vary according to the resistance value of the memory cell MC. As illustrated in FIG. 9B, since the cell current Icell flows in the memory cell MC, the level of the voltage of the sensing node N1 gradually decreases.

When the resistance value of the memory cell MC corresponds to high resistance HRS, the cell current Icell decreases and thus the level of the voltage of the sensing node N1 gradually decreases. In contrast, when the resistance value of the memory cell MC corresponds to low resistance LRS, the cell current Icell increases and thus the level of the voltage of the sensing node N1 rapidly decreases. In the voltage read method, data may be determined according to a result of comparison between the level of the voltage Vsen of the sensing node N1 and the level of the reference voltage Vref at an activation time Ts of the sensing enable signal SAE.

Figure 10A:
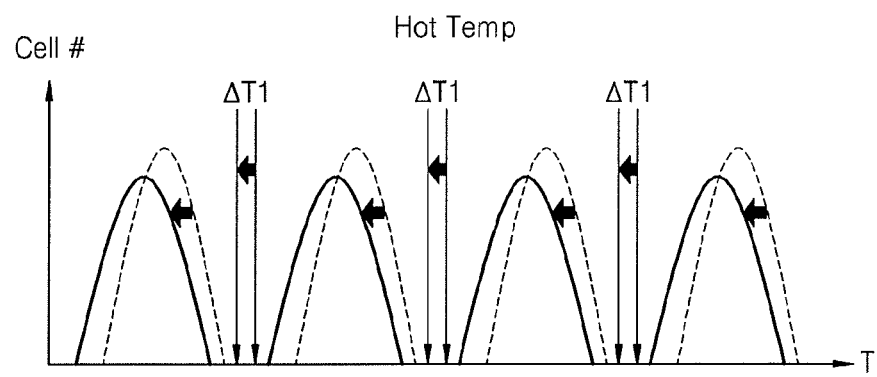
FIGS. 10A and 10B illustrate additional examples of memory cell distributions.
Figure 10B:
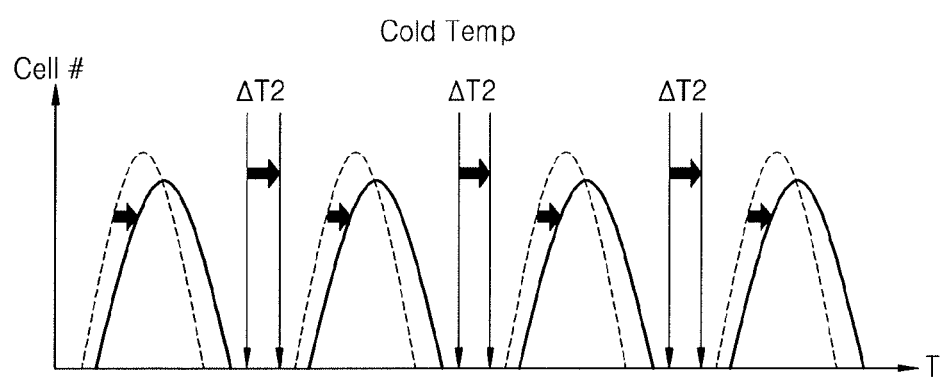
Figure 11:
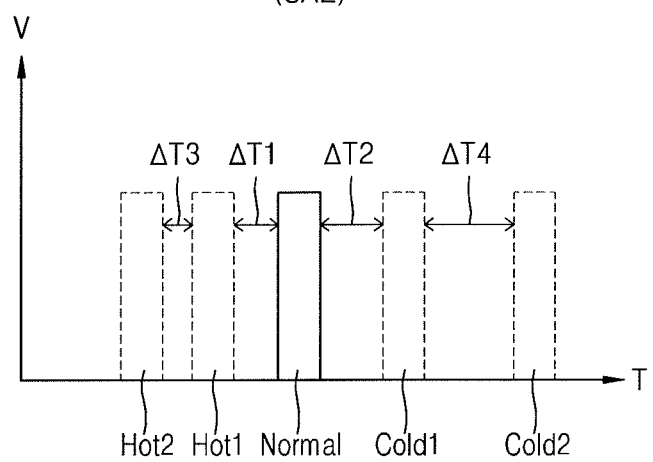
FIG. 11 illustrates an embodiment for adjusting a sensing enable signal.

FIGS. 10A, 10B, 11, and 12 illustrate examples of temperature compensation performed for the exemplary embodiment of FIGS. 9A and 9B. FIGS. 10A and 10B illustrate examples of a change in distribution of memory cells based on temperature change. FIG. 11 illustrates an example for adjusting a sensing enable signal according to temperature change. FIGS. 12A, 12B, and 12C illustrate examples of compensation performed based on adjustments of the levels of a precharge signal, a clamping signal, and a reference voltage.

Also, FIGS. 10A and 10B illustrate a case in which each memory cell is a multilevel cell that stores two bits of data. In these figures, the vertical axis indicates the number of memory cells and the horizontal axis indicates time, e.g., activation timing of the sensing enable signal SAE. Accordingly, a cell distribution at the right side in each of FIGS. 10A and 10B indicates a distribution of memory cells having a relatively high resistance value. A cell distribution at the left side in each of FIGS. 10A and 10B indicates a distribution of memory cells having a relatively low resistance value.

Referring to FIG. 10A, the resistance value of the memory cell decreases in the hot state Hot Temp that is greater than the temperature of the normal state. Accordingly, the level of the cell current may increase. Also, as the level of the cell current increases, the voltage of the sensing node N1 rapidly decreases. As the sensing enable signal SAE is adjusted to be activated earlier, compensation according to the temperature change may be performed.

In contrast, the resistance value of the memory cell increases in the cold state Cold Temp that is lower than the temperature of the normal state. Accordingly, the level of the cell current may decrease. As the level of the cell current decreases, the voltage of the sensing node N1 gradually decreases. Accordingly, as the sensing enable signal SAE is adjusted to be activated later, compensation according to the temperature change may be performed.

Similar to the above-described exemplary embodiment, the resistance value of the memory cell may vary non-linearly according to the change in temperature. For example, the amount of change of the resistance value when the temperature of (e.g., inside) the memory device 100 increases may be less than the amount of change of the resistance value when the temperature decreases. Accordingly, in compensating the activation timing of the sensing enable signal SAE, when the temperature inside the memory device 100 changes from the normal state to the hot state Hot Temp, the activation timing of the sensing enable signal SAE may be rapidly activated by $\Delta T1$.

When the temperature inside the memory device 100 changes from the normal state to the cold state Cold Temp, the activation timing of the sensing enable signal SAE may be activated more slowly by ΔT2, which is greater than ΔT1.

When the temperature inside the memory device 100 decreases, the amount of change of the resistance value increases (and thus a value of ΔT2) may be set to be greater than the value of ΔT1. Accordingly, compensation reflecting the non-linearity of the resistance value may be performed.

FIG. 11 illustrates an example of how the activation timing of the sensing enable signal SAE changes, step by step, when the temperature of the memory device 100 changes. In this example, the hot state has at least two steps and the cold state has at least two steps.

Referring to FIG. 11, when the temperature inside the memory device 100 is in a first hot state HOT 1, the activation timing of the sensing enable signal SAE may be adjusted to be activated earlier by ΔT1 compared to the normal state. When the temperature inside the memory device 100 is in a second hot state HOT 2 that is higher than the first hot state HOT 1, the activation timing of the sensing enable signal SAE may be adjusted to be activated earlier by ΔT3 compared to the first hot state HOT 1.

When the temperature inside the memory device 100 is in a first cold state COLD 1, the activation timing of the sensing enable signal SAE may be adjusted to be activated later by ΔT2 compared to the normal state. When the temperature inside the memory device 100 is in a second cold state COLD 2 that is lower than the first cold state COLD 1, the activation timing of the sensing enable signal SAE may be adjusted to be activated later by ΔI4 compared to the first cold state COLD 1.

Thus, as the temperature increases, the amount of compensation may decrease and thus the value of ΔT3 may be set to be less than the value of ΔT1. Conversely, as the temperature decreases, the amount of compensation may increase and thus the value of ΔT4 may be set to be greater than the value of ΔT2.

Figure 12A:
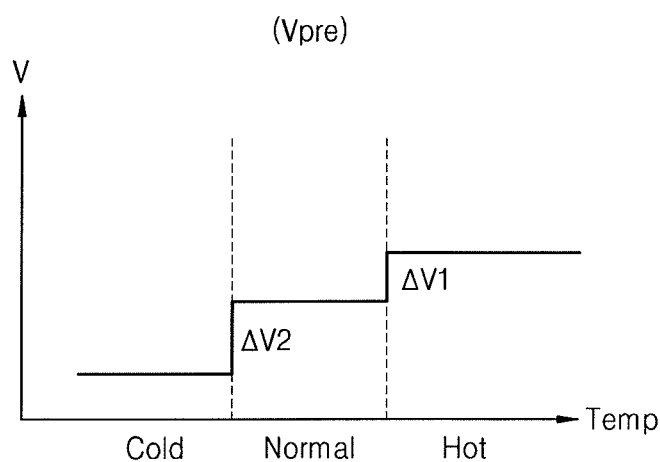
FIGS. 12A to 12C illustrate examples of various types of compensation.
Figure 12B:
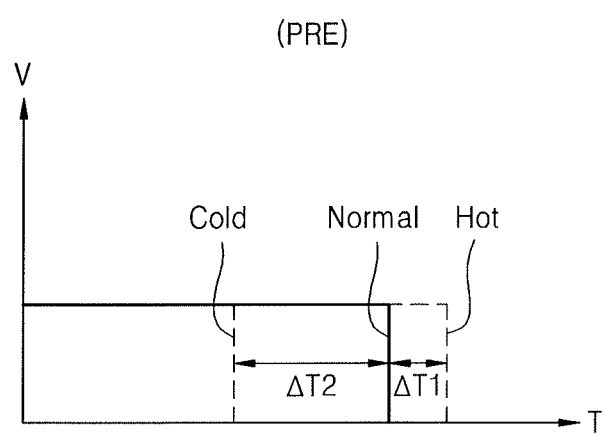
Figure 12C:
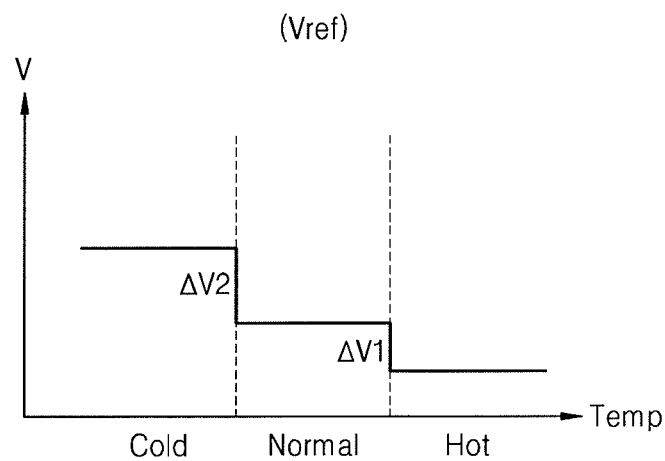

FIGS. 12A to 12C illustrate examples for adjusting values of read factors according to a change in temperature. For example, the level of the precharge voltage Vpre or an active section of the precharge control signal PRE may be adjusted, or the level of the reference voltage Vref may be adjusted. When the temperature inside the memory device 100 is in the hot state, the voltage of the sensing node N1 may rapidly decrease. Accordingly, the memory cell in the high resistance state HRS may be incorrectly determined to be in the low resistance state LRS.

In contrast, when the temperature of the inside of the memory device 100 is in the cold state, the voltage of the sensing node N1 may slowly decrease. Accordingly, the memory cell in the low resistance state LRS may be incorrectly determined to be in the high resistance state HRS.

Referring to FIG. 12A, the level of the precharge voltage Vpre in the hot state may be adjusted to increase and the level of the precharge voltage Vpre in the cold state may be adjusted to decrease, compared to the precharge voltage Vpre in the normal state. For example, the level of the precharge voltage Vpre in the hot state may be increased by ΔV1 compared to the normal state, and the level of the precharge voltage Vpre in the cold state may be decreased by ΔV2 compared to the normal state. Also, ΔV2 may be set to be greater than ΔV1 to reflected the non-linearity of the resistance value of the memory cell. Thus, even when the level of the voltage of the sensing node N1 rapidly decreases in the hot state, the level of the voltage of the sensing node N1 is precharged to increase, and thus an incorrect data determination problem may be reduced or prevented. In contrast, in the cold state, the level of the voltage of the sensing node N1 may be precharged to decrease.

Referring to FIG. 12B, the active section of the precharge control signal PRE in the hot state may be adjusted to increase and the active section of the precharge control signal PRE in the cold state may be adjusted to decrease, compared to the normal state. Since the active sections of the precharge control signal PRE are different from each other, the amount of electrical charge in the capacitor Csa may vary. Accordingly, the voltage level of the sensing node N1 may vary according to the precharge operation.

For example, the active section of the precharge control signal PRE in the hot state may be increased by ΔT1, compared to the normal state. The active section of the precharge control signal PRE in the cold state may be decreased by ΔT2, compared to the normal state. Here, ΔT2 may be set to be greater than ΔT1 to reflect the non-linearity of the resistance value of the memory cell.

Referring to FIG. 12C, the level of the reference voltage Vref in the hot state may be adjusted to decrease and the level of the reference voltage Vref in the cold state may be adjusted to increase, compared to the reference voltage Vref in the normal state. For example, the level of the precharge voltage Vpre in the hot state may be decreased by ΔV1 compared to the normal state. The level of the precharge voltage Vpre in the cold state may be increased by ΔV2 compared to the normal state. Also, ΔV2 may be set to be greater than ΔV1 to reflect the non-linearity of the resistance value of the memory cell. In other words, even when the level of the voltage of the sensing node N1 rapidly decreases in the hot state, the incorrect data determination problem may be reduced or prevented by decreasing the level of the reference voltage Vref compared to the voltage of the sensing node N1. Also, even when the level of the voltage of the sensing node N1 slowly decreases in the cold state, the incorrect data determination problem may be reduced or prevented by increasing the level of the reference voltage Vref compared to the voltage of the sensing node N1.

Figure 13A:
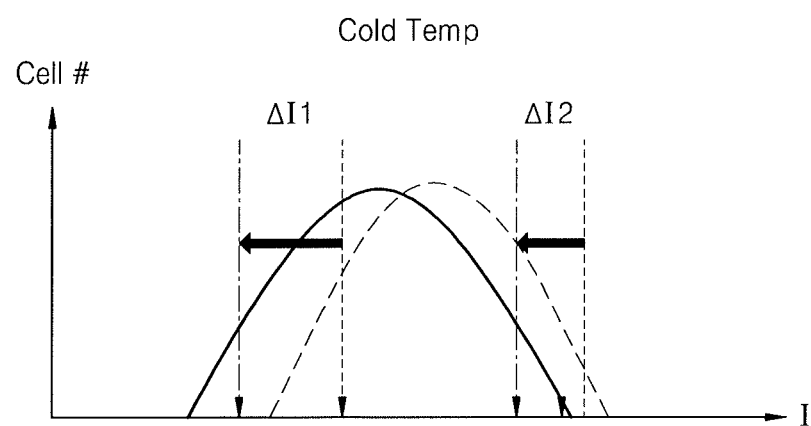
FIGS. 13A and 13B illustrate examples of setting read conditions during a verification operation.
Figure 13B:
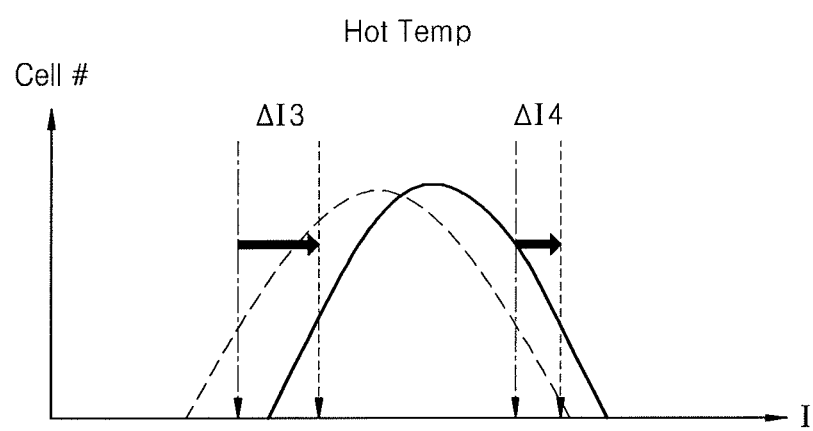

FIGS. 13A and 13B illustrate examples of setting read conditions during a verification operation. As illustrated in FIG. 2, a verification operation may be performed based on a verification voltage Vver and/or a verification current Iver. In FIGS. 13A and 13B, a verification operation based on verification current Iver is illustrated. Also, in FIGS. 13A and 13B, the horizontal axis corresponds to current and the vertical axis corresponds to the number of cells. The memory cell at the right side of a cell distribution may have a relatively low resistance value, whereas the memory cell at the left side of the cell distribution may have a relatively high resistance value.

Referring to FIG. 13A, when the memory device 100 is in the cold state COLD, the cell distribution of the memory cells on which data write is performed may be moved in a direction in which the resistance value increases or a current value decreases. Accordingly, in performing the verification operation on the memory cells, temperature compensation may be performed and the verification operation may be performed in two directions to decrease a width of the cell distribution.

In FIG. 13A, as the cell distribution is moved in a direction in which the cell current decrease, the level of the verification current Iver for the verification operation on the memory cells may be adjusted to decrease. For example, when first and second verification currents Iver1 and Iver2 are used for the bidirectional verification operation, the level of the first verification current Iver1 may be decreased by ΔI1 and the level of the second verification current Iver2 may be decreased by ΔI2. The change amounts ΔI1 and ΔI2 may be variously set. For example, the change amount ΔI1 of the level of the first verification current Iver1 to verify the memory cells having relatively high resistance values may have a relatively large value. In another embodiment, ΔI1 and ΔI2 may be substantially the same or ΔI2 may be set to be greater than ΔI1.

Referring to FIG. 13B, when the memory device 100 is in the hot state HOT, the cell distribution of the memory cells on which data write is performed may be moved in a direction in which the resistance value decreases or a current value increases. Accordingly, in performing the verification operation on the memory cells, temperature compensation may be performed. For example, as the cell distribution is moved in a direction in which the cell current increases, the level of the verification current Iver for the verification operation on the memory cells may be adjusted to increase.

Also, as illustrated in FIG. 13B, the level of the first verification current Iver1 may be increased by ΔI3 and the level of the second verification current Iver2 may be increased by ΔI4. In the present embodiment, the change amount ΔI3 of the level of the first verification current Iver1 is described to have a relatively larger value than the change amount ΔI4 of the level of the second verification current Iver2. In another embodiment, ΔI3 and ΔI3 may be substantially the same or ΔI3 may be set to be greater than ΔI4.

Figure 14:
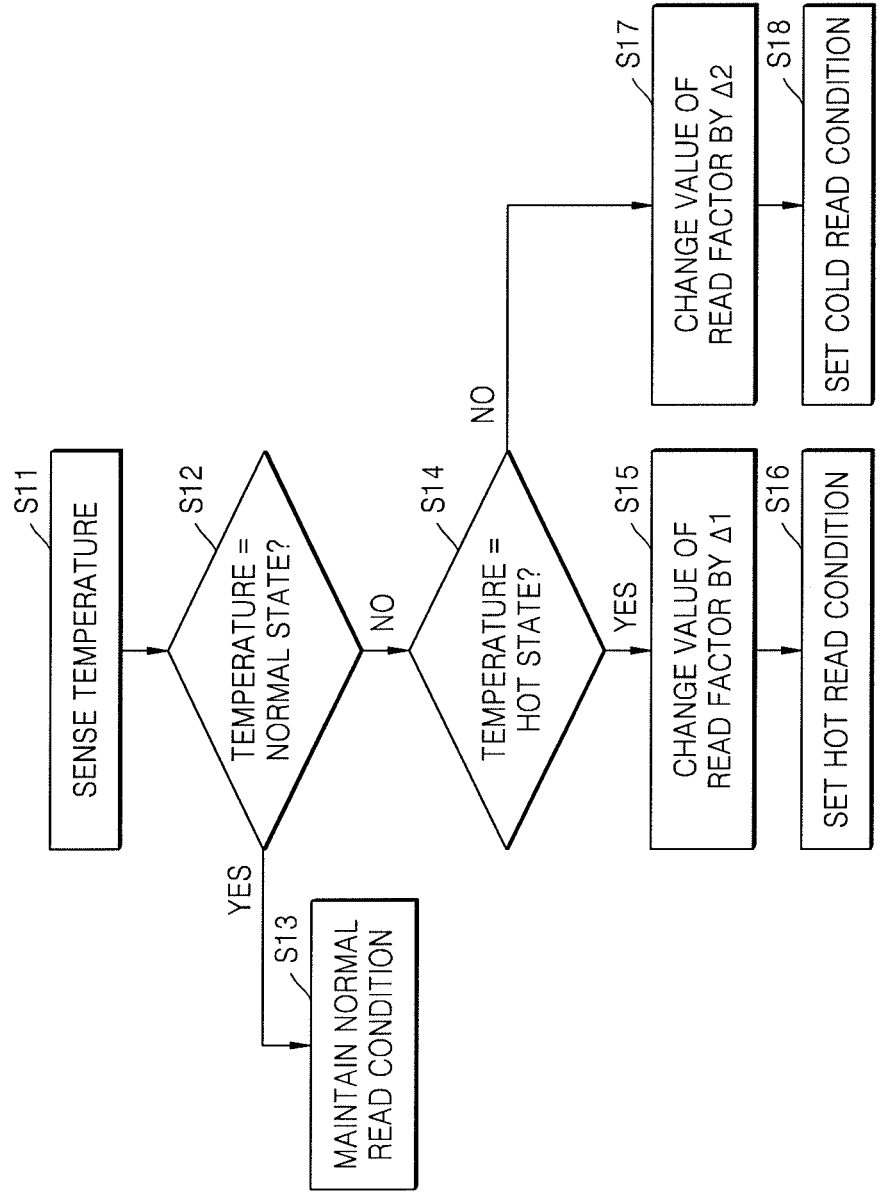
FIG. 14 illustrates an embodiment of a method for operating a resistive memory device.

FIG. 14 illustrates an embodiment of a method for operating a resistive memory device. The resistive memory device may correspond to any of the aforementioned embodiments. Also, the resistive memory device may include a temperature sensor.

Referring to FIG. 14, the method includes sensing the temperature inside the resistive memory device (S11). The temperature may be sensed by various methods. For example, operation S11 may be performed to sense whether the temperature inside the resistive memory device is higher or lower than a preset value or range corresponding to the normal state.

Temperature compensation may be performed in the read operation of the resistive memory device based on the sensed temperature. For example, the read operation on the memory cell may be performed by various methods, for example, a current sensing method or a voltage sensing method as in the above-described exemplary embodiment. Also, a plurality of read factors for a read condition may be used for each read method. According to the present exemplary embodiment, the read condition may be adjusted by changing a value of at least one read factor according to a change in temperature.

Whether the state of the temperature inside the memory device 100 corresponds to the normal state is determined based on the sensed temperature (S12). If the temperature inside the memory device 100 is in the normal state in a certain range, a currently set normal read condition is maintained (S13). Otherwise, whether the state of the temperature of the inside of the memory device 100 corresponds to the hot state or cold state may be determined (S14). As a result of this determination, if the temperature state is determined to be the hot state, a value (e.g., level or timing) of at least one of the read factors for the read condition is changed by a first value ΔI (S15). A hot read condition reflecting the above change may be set (S16). If the temperature state is determined to be the cold state, a value (e.g., level or timing) of at least one of the read factors for the read condition is changed by a second value Δ2 (S17). A cold read condition reflecting the above change may be set (S18).

Figure 15:
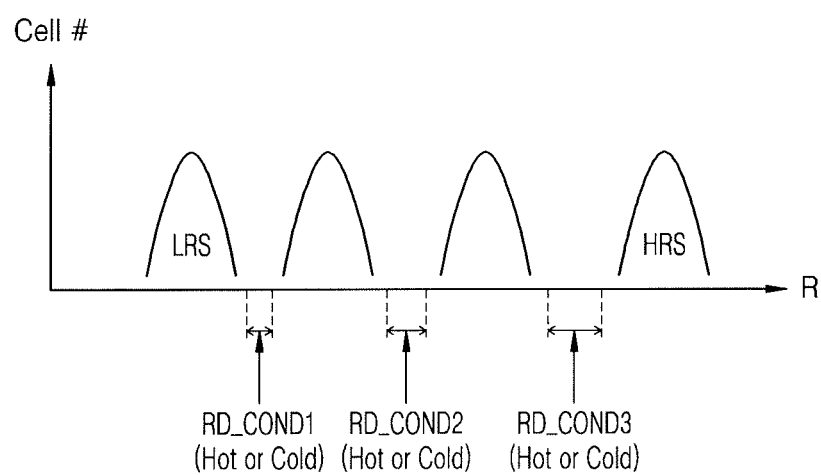
FIG. 15 illustrates an example of temperature compensation for a multilevel memory cell.

FIG. 15 illustrates an embodiment for performing temperature compensation for a multilevel cell. As illustrated in FIG. 15, each memory cell stores two bits of data and the memory cells may have four resistance level distributions. During the read operation, data may be determined by first to third read conditions RD_COND1 to RD_COND3.

As in the above-described exemplary embodiment, the temperature inside the memory device 100 is sensed, and the read condition may be adjusted by changing a value of at least one of the read factors with respect to each of the first to third read conditions RD_COND1 to RD_COND3 according to the sensed temperature.

Temperature compensation may be performed by employing the above-described exemplary embodiments with respect to each read condition. For example, the amount of a change of the value of the read factor in the hot state may be set to be greater than that in the cold state.

In a particular temperature state, the amount of a change of the read factor of each of the first to third read conditions RD_COND1 to RD_COND3 may be set to be different from each other. For example, the level of the reference current Iref as the read factor is changed. When the memory device 100 corresponds to the hot state, each of the first to third read conditions RD_COND1 to RD_COND3 may be set to have the level of the reference current Iref corresponding to the hot read state. In the hot state, the level of the reference current Iref of the first read condition RD_COND1 may be increased by ΔI1 compared to the normal state. Also, the level of the reference current Iref of the second read condition RD_COND2 may be increased by ΔI2 compared to the normal state. Also, the level of the reference current Iref of the third read condition RD_COND3 may be increased by ΔI3 compared to the normal state.

The values of ΔI1, ΔI2, and ΔI3 may be different from one another. For example, as illustrated in FIG. 15, the value of ΔI3 may be relatively high, where ΔI3 corresponds to the amount of change of the read factor of the third read condition RD_COND3 to determined data of the memory cell in a high resistance state. In another embodiment, the value of ΔI1 may be set to be relatively high, wherein ΔI1 corresponds to the amount of change of the read factor of the first read condition RD_COND1 to determined data of the memory cell in a low resistance state.

Figure 16:
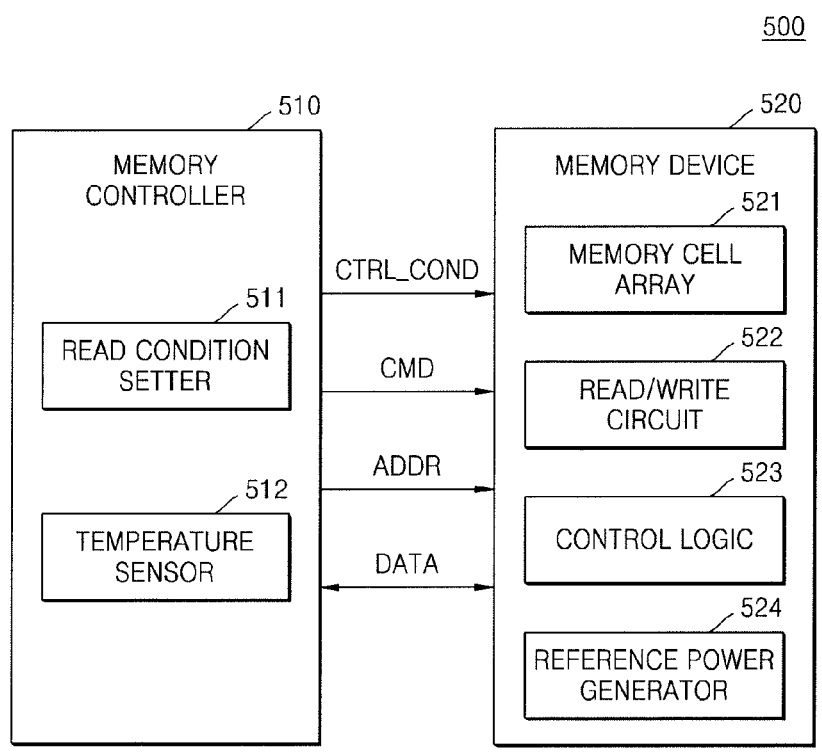
FIG. 16 illustrates another embodiment of a memory system.

FIG. 16 illustrates an embodiment of a memory system 500 including a memory device 520. Referring to FIG. 16, the memory system 500 includes a memory controller 510 and the memory device 520. The memory controller 510 includes a read condition setter 511 and a temperature sensor 512. The memory device 520 includes a memory cell array 521, a read/write circuit 522, a control logic 523, and a reference power generator 524. When the memory cell array 521 includes resistive memory cells, the memory system 500 may be referred to as a resistive memory system. The elements illustrated in FIG. 16 may be the same or similar to many of those in FIG. 1.

The read condition setter 511 outputs various control signals CTRL_COND for setting a read condition to the memory device 520. Thus, the memory device 520 may control the adjustment of values of various read factors based on the control signals CTRL_COND. For example, the control signal CTRL_COND may include signal to control the reference current Iref, the reference voltage Vref, the sensing enable signal SAE, the precharge control signal PRE, and the precharge voltage Vpre, which are described in the above-described exemplary embodiments. Also, the read condition setter 511 may generate the control signal CTRL_COND based on the sensing signal from the temperature sensor 512.

The memory device 520 may perform a memory operation based on the address ADDR and the command CMD from the memory controller 510, or may receive write data DATA from the memory controller 510 or output read data DATA to the memory controller 510. Also, the memory device 520 may change the values of the read factors based on the control signal CTRL_COND. For example, the reference power generator 524 may adjust the levels of the reference current Iref and/or the reference voltage Vref based on the control signal CTRL_COND.

In another embodiment, the control logic 523 may generate the sensing enable signal SAE and the precharge control signal PRE. Based on the control signal CTRL_COND, the control logic 523 may control the activation timing of the sensing enable signal SAE and/or a width of activation of the precharge control signal PRE. The memory device 520 may also include a power generator generating various power signals for the write and read operations. The power generator may change the level of the precharge voltage Vpre based on the control signal CTRL_COND.

Figure 17:
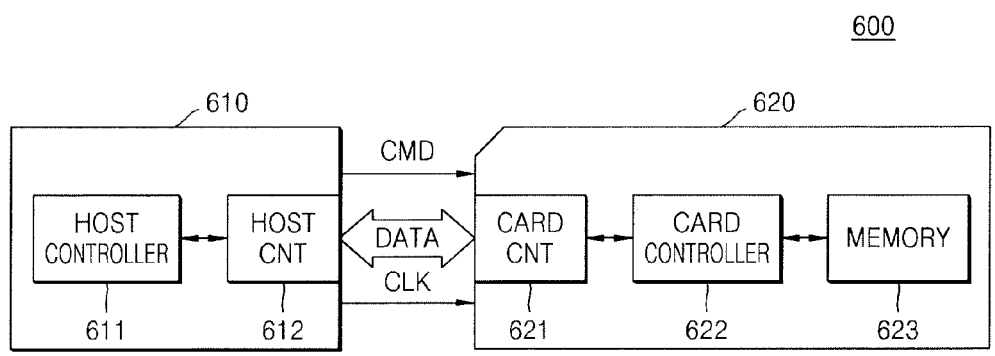
FIG. 17 illustrates one application of the memory system.

FIG. 17 illustrates an embodiment where a memory system according to any one of the above-described exemplary embodiments is applied to a memory card system 600. The memory system is assumed to be a resistive memory system.

Referring to FIG. 17, the memory card system 600 includes a host 610 and a memory card 620. The host 610 includes a host controller 611 and a host connector 612. The memory card 620 includes a card connector 621, a card controller 622, and a memory device 623. The memory device 623 may corresponding to any of the exemplary embodiments in FIGS. 1 to 16. Accordingly, the memory device 623 may sense temperature inside the memory device 623 and adjust the read condition by changing the value of one or more read factors for the read operation based on the sensed temperature.

The host 610 may write data to the memory card 620 or read data from the memory card 620. The host controller 611 may transmit a command CMD, a clock signal CLK generated by a clock generator in the host 610, and data DATA to the memory card 620 via the host connector 612.

Based on the command CMD from the card connector 621, the card controller 622 may store the data DATA in the memory device 623 in synchronism with the clock signal CLK generated by the clock generator in the card controller 622. The memory device 623 may store the data DATA transmitted from the host 610.

The memory card 620 may be, for example, a compact flash card (CFC), a microdrive, a smart media card (SMC), a multimedia card (MMC), a security digital card (SDC), a memory stick, or a USB flash memory driver.

Figure 18:
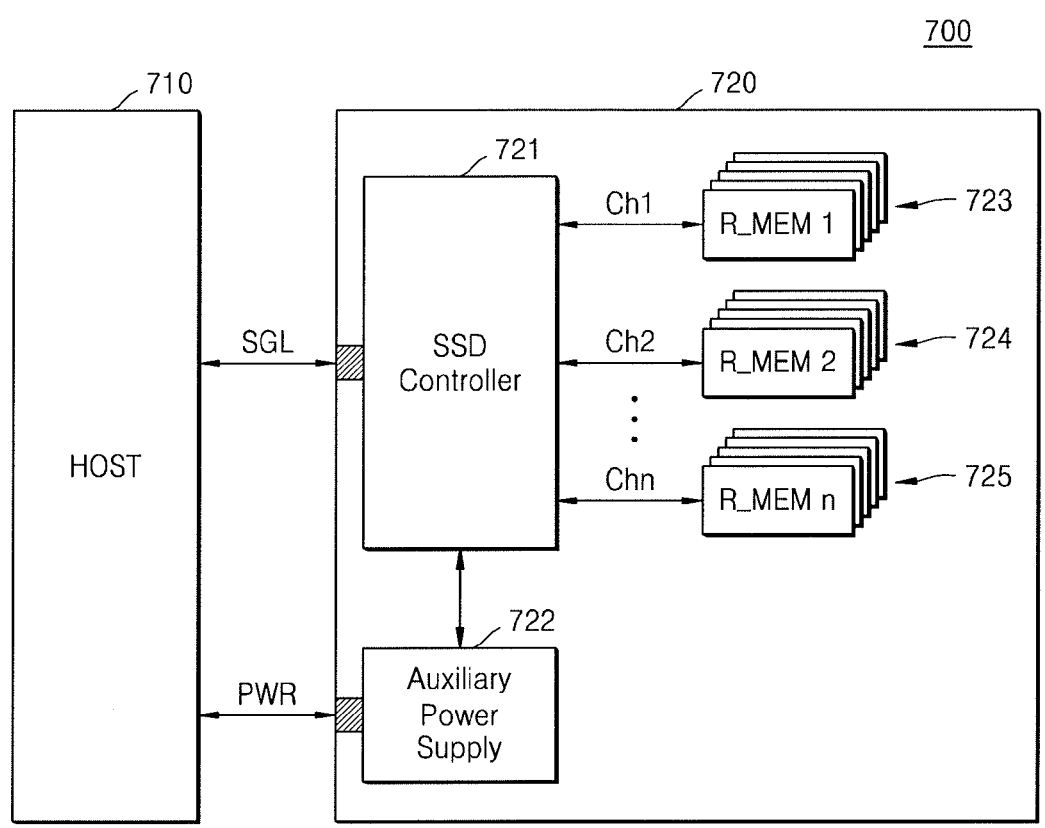
FIG. 18 illustrates another application of the memory system.

FIG. 18 illustrates an embodiment wherein a memory system according to any one of the above-described exemplary embodiments is applied to a SSD system 700.

Referring to FIG. 18, the SSD system 700 includes a host 710 and an SSD 720. The SSD 720 may exchange signals with the host 710 via a signal connector and may receive an input of power through a power connector. The SSD 720 may include an SSD controller 721, an auxiliary power supply 722, and a plurality of memory devices 723, 724, and 725. The SSD 720 may correspond to any of the exemplary embodiments in FIGS. 1 to 16. Accordingly, each of the memory devices 723, 724, and 725 may sense temperature inside each device and may adjust the read condition by changing a value of one or more read factors for a read operation based on the sensed temperature.

Figure 19:
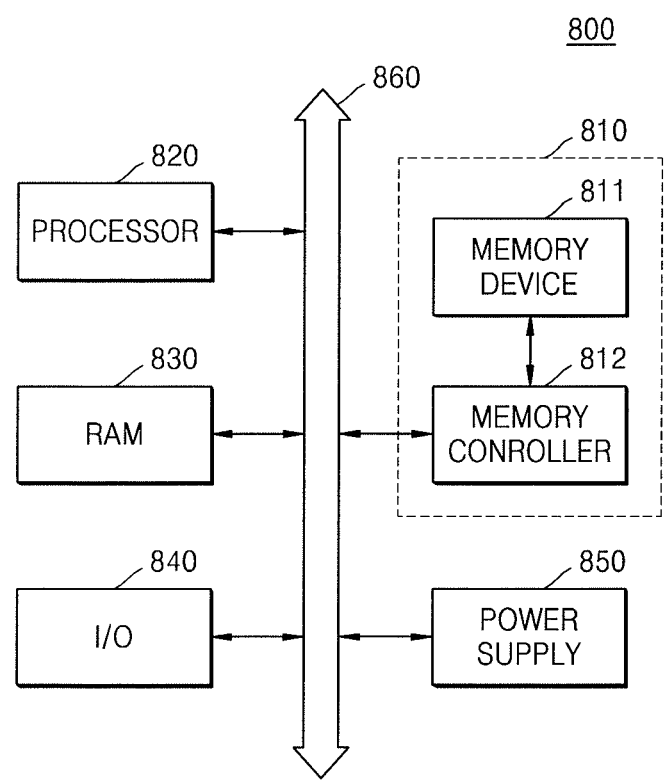
FIG. 19 illustrates an embodiment of a computing system.

FIG. 19 illustrates an embodiment of a computing system 800 including a memory system 810 according to any one of the above-described exemplary embodiments. The memory system 810 is assumed to be a resistive memory system.

Referring to FIG. 19, the computing system 800 includes the memory system 810, a processor 820, RAM 830, an input/output (I/O) device 840, and a power supply 850. The memory system 810 includes a memory device 811 and a memory controller 812. In one embodiment, the computing system 800 may include one or more ports that may communicate with a video card, a sound card, a memory card, a USB device. etc. or other electronic devices. The computing system 800 may be, for example, a personal computer or a portable electronic apparatus such as a notebook computer, a mobile phone, a personal digital assistant (PDA), or a camera.

The processor 820 may perform particular calculations or tasks. In some exemplary embodiments, the processor 820 may be a micro-processor or a central processing unit (CPU). The processor 820 may perform communication with the RAM 830, the I/O device 840, and the memory system 810 via a bus 860 such as an address bus, a control bus, and a data bus. The memory system 810 and/or the RAM 830 may be, for example, any of the embodiments of the resistive memory device in FIGS. 1 to 16.

According to an exemplary embodiment, the processor 820 may be connected to an extended bus, e.g., a peripheral component interconnect (PCI) bus.

The RAM 830 stores data for operation of the computing system 800. As described above, the memory device may correspond to any of the embodiments of the aforementioned memory device. In one embodiment, the RAM 830 may be a DRAM, mobile DRAM, SRAM, PRAM, FRAM, or MRAM.

The I/O device 840 may include an input device such as a keyboard, a keypad, or a mouse, and an output device such as a printer or a display. The power supply 850 may supply an operating voltage for operating the computing system 800.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, control logic, adjusters, and other processing features of the disclosed embodiments may be implemented in logic which, for example, may include hardware, software, or both. When implemented at least partially in hardware, the BMS may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, control logic, adjusters, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

Another embodiment may include a computer-readable medium, e.g., a non-transitory computer-readable medium, for storing the code or instructions described above. The computer-readable medium may be a volatile or non-volatile memory or other storage device, which may be removably or fixedly coupled to controllers, control logic, adjusters, and other processing features which is to execute the code or instructions for performing the embodiments described herein.

In accordance with one or more of the aforementioned embodiments, compensation is performed on at least one read factor included in a read condition based on a change in temperature. As a result, read performance may be improved in various read methods such as a current sensing method and a voltage sensing method. Also, even when the resistance value is changed non-linearly based on a temperature change, temperature compensation may be effectively performed.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A method for operating a resistive memory device, the method comprising:
   sensing a change in temperature of the memory device;
   adjusting a level of a reference current from a reference value to a first value for a read operation when the temperature increases and from the reference value to a second value for the read operation when the temperature decreases; and
   reading data from memory cells of the memory device based on the adjusted level of the reference current, wherein a difference between the reference value and the first value is different from a difference between the reference value and the second value.

2. The method as claimed in claim 1, wherein:
   the first value is greater than the reference value, and
   the second value is less than the reference value.

3. The method as claimed in claim 1, wherein adjusting the level of the reference current includes adjusting the reference value to the first value or the second value based on a current control signal.

4. The method as claimed in claim 1, wherein:
   sensing the temperature change includes generating a first sensing signal indicating an increase in temperature compared to a normal state or a second sensing signal indicating a decrease in temperature compared to the normal state, and
   adjusting the level of the reference current includes adjusting the level of the reference current to the first value or the second value based on the first sensing signal or the second sensing signal.

5. The method as claimed in claim 1, wherein reading the data includes:
   comparing a sensing node voltage with a reference voltage,
   wherein the sensing node voltage is applied to a sensing node based on the adjusted level of the reference current.

6. The method as claimed in claim 1, wherein:
   the memory cells include multilevel cells, and
   the method includes changing first to n-th reference currents, where n≥2, and reading data from the multilevel cells based on the first to n-th reference currents, wherein levels of the first to n-th reference currents are changed by different amounts.

7. The method as claimed in claim 1, wherein:
   sensing includes sensing that the change in temperature corresponds to one of m-number of states compared to a normal state, where m≥2, and
   adjusting the level of the reference current includes adjusting the level of the reference current to one of m-number of levels based on the sensed one of the m-number of states.

8. The method as claimed in claim 1, wherein a difference in the level between the reference value and the first value is less than a difference in the level between the reference value and the second value.

* * * * *